United States Patent
Redecker et al.

(10) Patent No.: US 7,285,795 B2
(45) Date of Patent: Oct. 23, 2007

(54) VERTICAL FIELD-EFFECT TRANSISTOR, METHOD OF MANUFACTURING THE SAME, AND DISPLAY DEVICE HAVING THE SAME

(75) Inventors: Michael Redecker, Berlin (DE); Joerg Fischer, Berlin (DE); Arthur Mathea, Berlin (DE)

(73) Assignee: Samsung SDI Co., Ltd., Suwon (KR)

( * ) Notice: Subject to any disclaimer, the term of this patent is extended or adjusted under 35 U.S.C. 154(b) by 79 days.

(21) Appl. No.: 11/073,867

(22) Filed: Mar. 8, 2005

(65) Prior Publication Data

US 2005/0202587 A1    Sep. 15, 2005

(30) Foreign Application Priority Data

Mar. 11, 2004  (EP) ................................ 04090102
Jul. 8, 2004   (KR) .................... 10-2004-0052917

(51) Int. Cl.
  *H01L 35/24*  (2006.01)
  *H01L 29/04*  (2006.01)
(52) U.S. Cl. ............................ 257/40; 257/59; 257/72; 257/79
(58) Field of Classification Search ................. 257/79, 257/40, 59, 72, 350
  See application file for complete search history.

(56) References Cited

U.S. PATENT DOCUMENTS 5,676,853 A   10/1997  Alwan ........................ 216/11
6,166,397 A * 12/2000  Yamazaki et al. ............ 257/59
6,614,069 B2 * 9/2003  Rosner et al. ............... 257/315
2001/0014426 A1  8/2001  Michiels et al. ................ 430/5
2002/0121662 A1  9/2002  Rosner et al. .............. 257/329
2003/0015698 A1 * 1/2003  Baldo et al. ................... 257/40
2005/0173701 A1 * 8/2005  Kawase et al. ............... 257/40

FOREIGN PATENT DOCUMENTS

EP        1 265 103 A1    12/2002
EP        1 281 666 A1     2/2003
WO       WO 02/29912       4/2002

OTHER PUBLICATIONS

European Search Report dated Aug. 12, 2004, 11 pages, EP 04 09 0102.
Search Report dated Jan. 24, 2002, 3 pages, PCT/GB 01/04421.
Encapsulated Inorganic Resist Technology Applied to 157 NM-Lithography; Theodore H. Fedynyshyn et al.; Proceedings of SPIE, vol. 4345; 2001; pp. 308-318.

* cited by examiner

*Primary Examiner*—Michael Trinh
(74) *Attorney, Agent, or Firm*—H.C. Park & Associates, PLC

(57) ABSTRACT

Provided are a vertical field-effect transistor, a method of manufacturing the same, and a display device having the same. The method is highly reproducible and can be used to manufacture a vertical organic field-effect transistor at a low cost. In addition, the method does not require photolithography and a shadow mask. In the vertical field-effect transistor, a source electrode is formed on a substrate, and an insulating layer and discontinuous gate electrodes are formed. Then, a charge carrier block layer, an organic semiconductor material, and a drain electrode are formed. The gate electrodes are formed using nanoparticles.

5 Claims, 12 Drawing Sheets

VERTICAL FIELD-EFFECT TRANSISTOR, METHOD OF MANUFACTURING THE SAME, AND DISPLAY DEVICE HAVING THE SAME

This application claims priority to European Patent Application No. EP 040901027, filed on Mar. 11, 2004, and Korean Patent Application No. 2004-52917, filed on Jul. 8, 2004, which are both incorporated herein in their entirety by reference.

BACKGROUND OF THE INVENTION

1. Field of the Invention

The present invention may relate to a field-effect transistor, a display device having the same, and a method of manufacturing the same. More particularly it may relate to a vertical field-effect transistor, a display device having the same, and a method of manufacturing the same.

2. Description of the Related Art

Organic electronic engineering may be applied to a display device, such as an organic light emitting diode, and to a field-effect transistor. Organic electronic engineering also may realize a single electronic circuit that can be manufactured without a complicated semiconductor manufacturing process. The circuits manufactured by a method based on an organic polymer semiconductor may be used to activate large size displays and also may be used in the field of transponders.

In a field-effect transistor structure based on organic materials, a semiconductor organic material may be arranged between a source electrode and a drain electrode. An electric field may be generated in an area (for example, a channel) between the source electrode and the drain electrode by applying a predetermined voltage to a gate electrode. As a result, charge carriers, (for example, electrons or holes) may be introduced into the channel formed of the organic material and may increase conductivity between a source contact and a drain contact. In this case, a line in a channel of a p-type transistor structure may be realized through the holes, and a line in a channel of an n-type transistor structure may be realized through the electrons. The transistor may be controlled by a gate voltage.

A charge carrier block layer, (for example, a dielectric layer) may be arranged between the channel and the gate electrode, and may prevent the migration of corresponding charges from the gate electrode to the channel. Such migration may deteriorate the quality of a desired electric field and of the transistor structure.

Such a structure may have a low maximum attainable current. The maximum attainable current may be an important factor of the adaptability of an organic transistor, such as one for use in an active matrix OLED display.

The maximum attainable current is determined based on the width and the length of a conductive channel (which is formed of an organic semiconductor material) and the charge carrier movement. Examples of organic materials include small molecular compounds like perylene tetra carboxylic acid diimide as an n-type semiconductor and diimide derivative of naphthaline tetra carboxylic acid diimide, as well as pentacenes, tatracences, and oligo thiophenes as p-type semiconductors. Other examples of organic materials may include polymers like a copolymer of alkylfluorene unites of alkythiophenes and polyalkylthiophenes.

Having the length of the channel small and the width and the movement of the channel large may help to obtain a maximum current. Another factor for obtaining the maximum current is the thickness of the organic semiconductor that defines the thickness of the channel. A channel used for the current modulation between the source electrode and the drain electrode may operate on a very thin layer that is located near the charge carrier block layer. Accordingly, it may not be necessary to increase the thickness of the organic semiconductor. Thicker semiconductor layer may deteriorate the current ratio in a switch-on state and a switch-off state. The optimum thickness of the semiconductor layer may be less than about 100 nanometers.

The charge carrier movement of the organic semiconductor may be significantly less than the charge carrier movement of an inorganic material, such as silicon. The typical movement of the organic semiconductor may be in a range from about $10^{-2}$ to about 1 $cm^2/Vs$. Accordingly, it may be necessary to balance out the small charge carrier movement by reducing the length of the channel in order to obtain a large maximum attainable current of an organic semiconductor that has small charge carrier movement. The typical channel length of an organic field-effect transistor is about 5 to about 100 micrometers. In general, a high resolution process, such as photolithography, may be performed to lower the channel length to less than about 5 micrometers. Such a method may have a higher cost and may destroy the value of the organic electronic engineering.

In order to avoid a photolithography process requiring a high cost and in order to obtain a parallel structure with a high resolution and reduce the channel length in order to obtain a higher current various solutions have been attempted. To this end, a method of depositing a source electrode and a drain electrode of an organic field-effect transistor while the source electrode and the drain electrode are not across each other and adjacent to each other is discussed in "Thin Solid Films, Vol 331(1998), pp. 51-54" by Kudo et al. and "Science, Vol 299(2003), pp. 1881-1884" by Stutzmann et al., which are incorporated herein by reference in their entirety.

In Kudo, the source electrode and the drain electrode are arranged on the substrate to overlap each other but not to be adjacent to each other. When the gate electrode is continuously arranged to the organic material, the flow of charge carriers from the source electrode to the drain electrode may be disrupted. More specifically, a large leakage current from the gate electrode to the source electrode may destroy the value of a field-effect transistor that can be controlled without using an electric power.

In Stutzmann a small portion of the surface of the transistor is used as the channel, but a large portion of the surface of the transistor may be needed for use as the channel, in order to obtain a large current by using a small sized transistor.

SUMMARY OF THE INVENTION

The present invention provides, *inter alia*, a vertical organic field-effect transistor having excellent reproducibility and low manufacture cost, a method of manufacturing the same, and a display device having the same. More specifically, the present invention provides a vertical organic field-effect transistor that may be manufactured without using a photolithography or a shadow mask.

The present invention also provides a method of manufacturing a vertical field-effect transistor. The method may include forming a first electrode on a substrate, forming an insulating layer on one surface of the first electrode, forming discontinuous gate electrodes on the insulating layer using nanoparticles, forming a charge carrier block layer on at least a portion of the discontinuous gate electrodes, forming an organic semiconductor layer covering the discontinuous portion of the discontinuous gate electrodes, and forming a second electrode on the organic semiconductor layer and the discontinuous gate electrodes.

The present invention may provide a vertical organic field-effect transistor having an excellent reproducibility and a method for manufacturing the same. The present invention may provide a vertical organic field-effect transistor at a low cost by avoiding the use of photolithography or a shadow mask.

The present invention may provide a vertical organic field-effect transistor having excellent performance by preventing or reducing a current leakage between gate electrodes and a source electrode. This may be accomplished by arranging an insulating layer between the electrodes. The present invention may provide a display device having a vertical field-effect transistor having excellent reproducibility and low manufacture cost.

DETAILED DESCRIPTION OF THE INVENTION

The present invention will now be described more fully with reference to the accompanying drawings, in which exemplary embodiments of the invention are shown.

Figure 1:
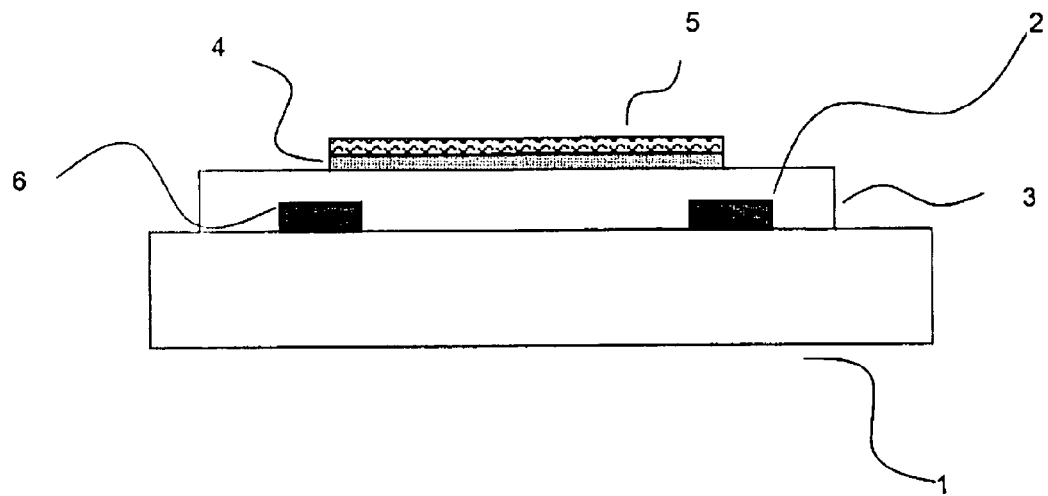
FIG. 1 is a sectional view illustrating a conventional organic field-effect transistor.

As shown in FIG. 1, a conventional organic field-effect transistor may include a source electrode 2 and a drain electrode 6 arranged adjacent to each other on a substrate 1. A gate electrode 5 and a charge block layer 4 may be arranged on the source electrode 2 and the drain electrode 6. The current between the source electrode 2 and the drain electrode 6 may be controlled by a voltage applied to the gate electrode 5. The length of a channel 3 formed of an organic semiconductor material may be defined by the space between the source electrode 2 and the drain electrode 6. In order to obtain a large current, the length of the channel 3 may be reduced to be smaller than about 5 gm by using a high-resolution method, such as photolithography.

Figure 2:
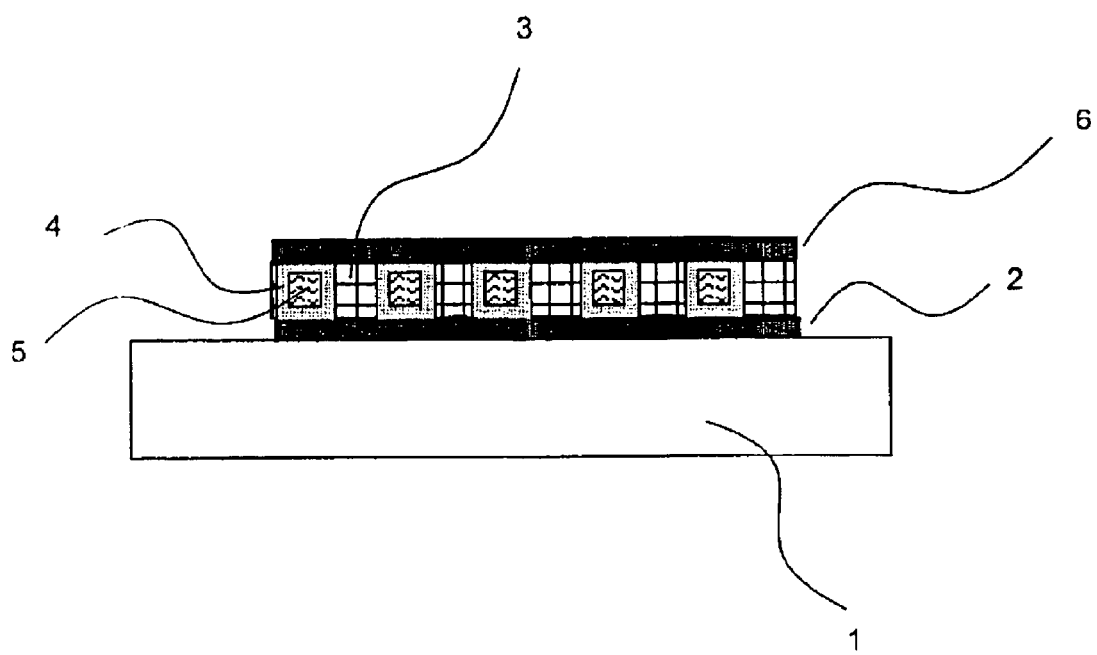
FIG. 2 is a sectional view illustrating a conventional vertical organic field-effect transistor.

As shown in FIG. 2, a conventional vertical organic field-effect transistor may include a source electrode 2 and a drain electrode 6 separately arranged on a substrate 1. Here, the length of a channel 3 that is formed of an organic material can be reduced to a nanometer size corresponding to the thickness of the channel 3. A gate electrode 5 may be formed discontinuously and/or by a porous method. This conventional vertical organic field-effect transistor may differ from the conventional field-effect transistor shown in FIG. 1.

As shown in FIGS. 3A, 3B, 3C, and 3D a vertical organic field-effect transistor may be manufactured. For example, a source electrode 2 may be deposited on a substrate 1 formed of a material such as glass, silicon, or flexible carrier foil. Here, the source electrode 2 may be deposited on the substrate 1 by vaporization under a high vacuum or by sputtering while including high quality metals (for example, gold, palladium, platinum, and nickel) or indium-tin-oxide (ITO). An insulating layer 8 (which may be, for example, a dielectric layer) may be deposited on the source electrode 2 by vaporization under a high vacuum, sputtering, or chemical vapor deposition (CVD).

The insulating layer 8 may be formed of, for example, $SiO_2$, $SiO_x$, $Si_3N_4$, or $Si_xO_y$. An actual functioning layer formed of a dielectric matrix 10 in which metal nanoparticles 13 are scattered may be formed on the insulating layer 8. Here, the metal nanoparticles 13 may serve as the gate electrodes 5. The actual functioning layer may be formed by cover vaporizing the metal nanoparticles 13 and the dielectric matrix 10. The nanoparticles 13 may be formed of, for example, Al, Ti, Ta, Zr, Hf, or Cr, and the dielectric matrix 10 may be formed of $SiO_x$.

The vertical organic field-effect transistor according to the first embodiment of the present invention may be manufactured by an anisotropic etching. The etching may selectively remove the dielectric matrix 10 and the insulating layer 8 arranged under the dielectric matrix 10 but may not damage the source electrode 2 and the gate electrodes 5. When the dielectric matrix 10 is $SiO_x$, the etching may be performed by using, for example, an etching gas including fluorine, such as $CF_4$, $CF_3H$, $C_4F_9$, $C_2F_6$, $CF_6$, or $NF_3$.

Figure 3A:
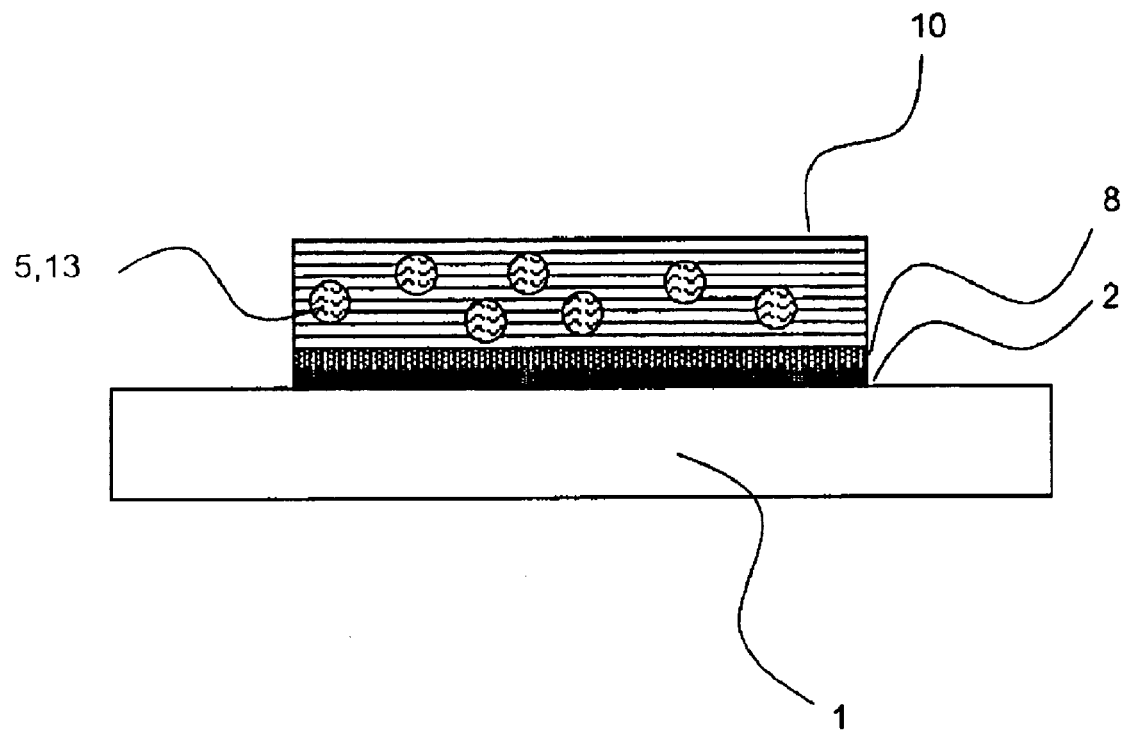
FIGS. 3A, 3B, 3C, and 3D are sectional views illustrating a method of manufacturing an organic field-effect transistor according to a first embodiment of the present invention.
Figure 3B:
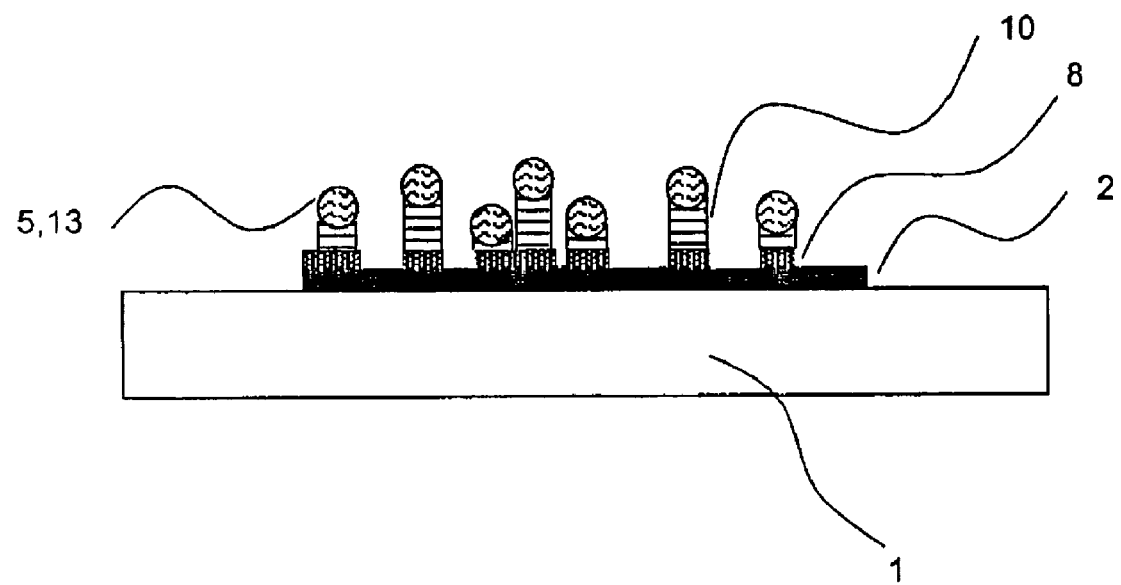
Figure 3C:
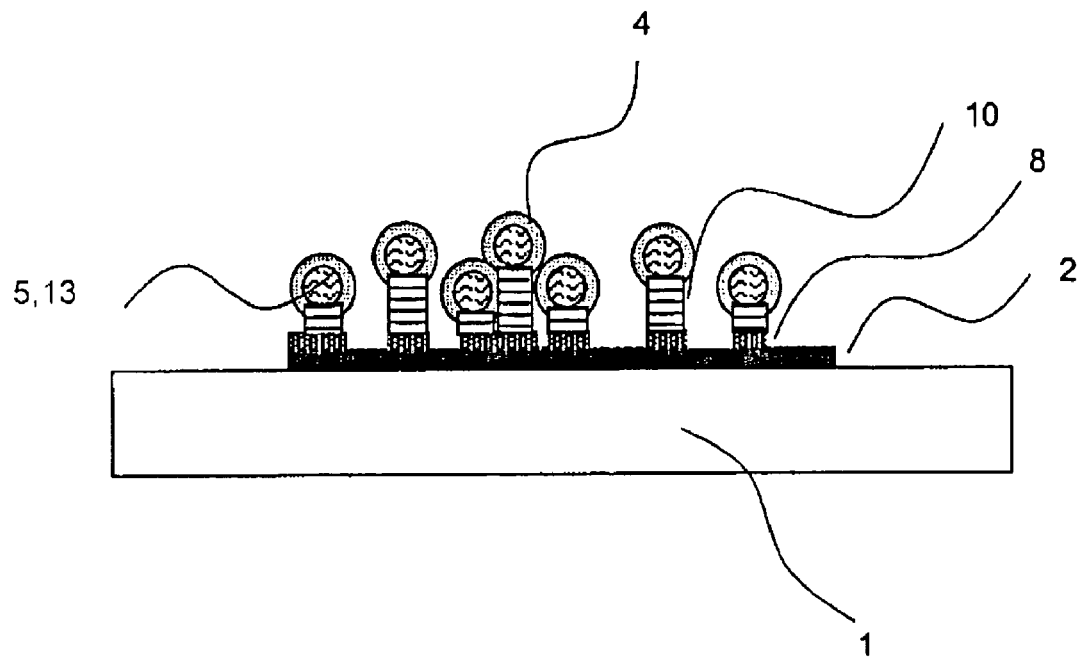
Figure 3D:
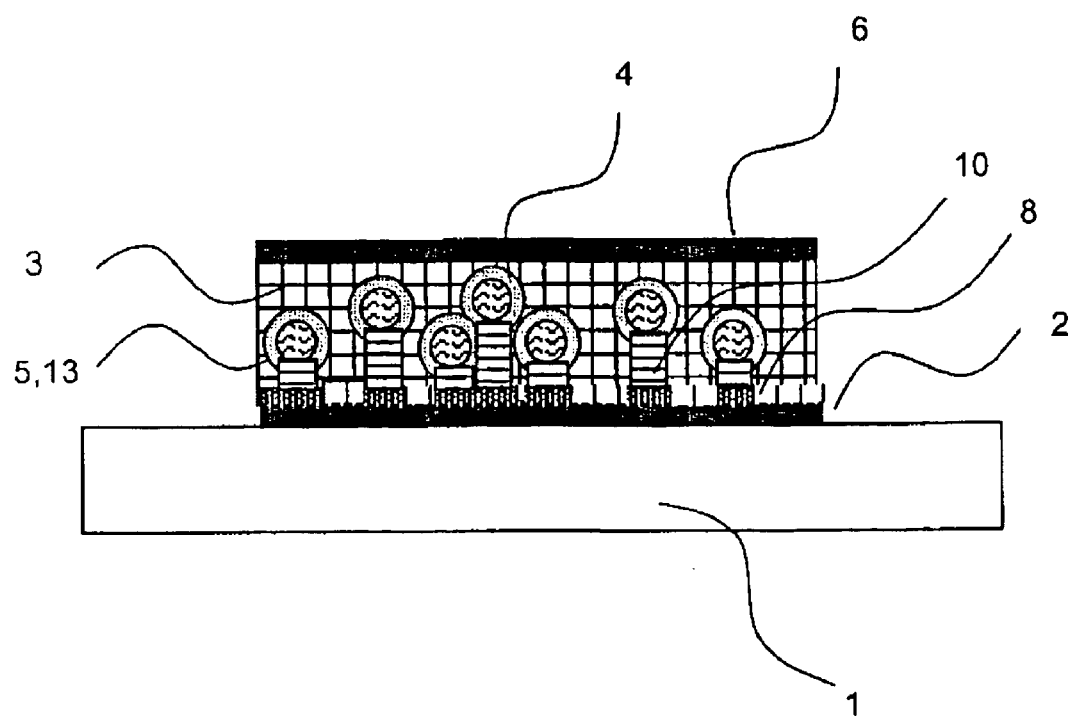

As shown in FIG. 3C, a charge carrier block layer 4 (for example, a dielectric layer) may be formed on the gate electrodes 5 by an oxidation process such as thermal oxidation, plasma oxidation, or anodizing. Then, an organic semiconductor 3 may be deposited by vaporization under a high vacuum or spin coating from a solution. The vertical organic field-effect transistor according to the first embodiment of the present invention may be completed by applying a drain contact 6 by vaporization under a high vacuum or sputtering. The drain contact 6 may be formed of, for example, gold, palladium, nickel, or ITO.

In the case of the vertical organic field-effect transistor, the gate electrodes 5 are formed of metal domains, in other words, the nanoparticles 13, on which oxide layers like the charge carrier block layers 4 conductively connected to one another and functioning as dielectrics are formed. The organic semiconductor 3 is filled in the spaces between the gate electrodes 5. In addition, the gate electrodes 5 may easily contact the outside due to the network of composing the metal domains.

As shown in FIGS. 4A, 4B, 4C, 4D, 4E, and 4F are sectional views illustrating a method of manufacturing a vertical organic field-effect transistor according to a second embodiment of the present invention.

A source electrode 2, an insulating layer 8, and a continuous gate electrode 5 may be deposited on a substrate. The source electrode 2 may be formed of a precious metal, such as Au, Pd, Pt, or Ni, and the insulating layer 8 may be formed of a material such as $Al_2O_3$, $SiO_2$, $SiO_x$, $Si_3N_x$, $TiO_2$, $Ta_2O_5$, $ZrO_2$, or $HfO_2$. The material of the gate electrode 5 may be determined based on the material of the insulating layer 8 (which may function as a dielectric layer). The gate electrode 5 and the insulating layer 8 may be formed of, for example, Al and $Al_2O_3$ or Ta and $Ta_2O_5$ in order to deposit a metal or a metal oxide without changing a target while performing sputtering.

Nanoparticles 13 to operate as an etch mask are coated on the surface of the gate electrode 5. Here, the nanoparticles 13 may be formed of polymer latex particles having a limited size, for example, polystyrene latex. In other case, the nanoparticles 13 may be formed of metal colloids, as well as inorganic nanoparticles, such as $SiO_2$ and $TiO_2$.

Figure 4A:
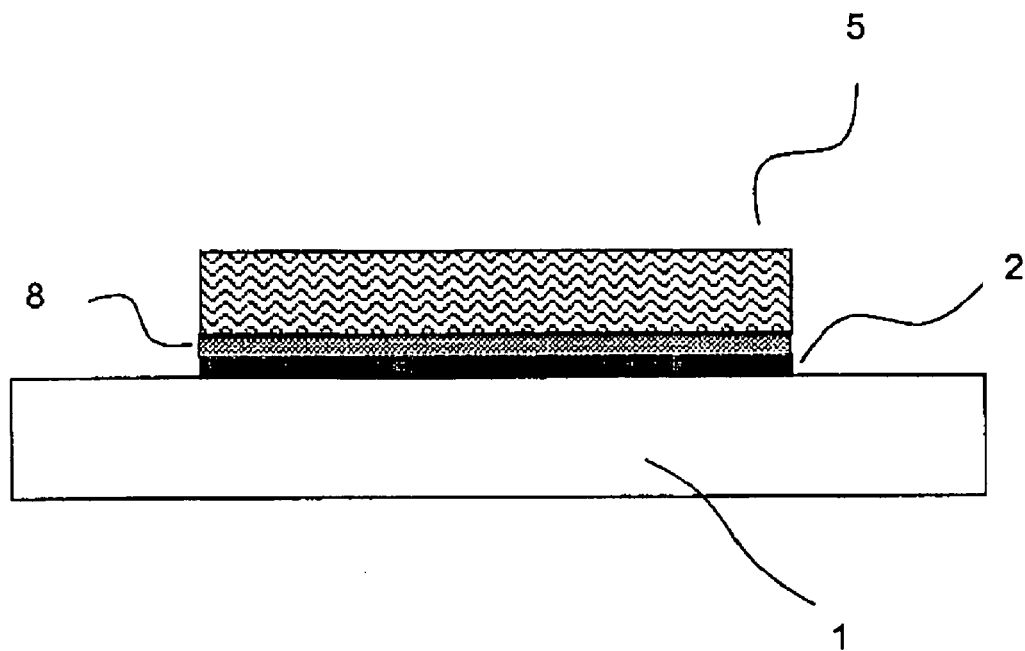
FIGS. 4A, 4B, 4C, 4D, 4E, and 4F are sectional views illustrating a method of manufacturing an organic field-effect transistor according to a second embodiment of the present invention.
Figure 4B:
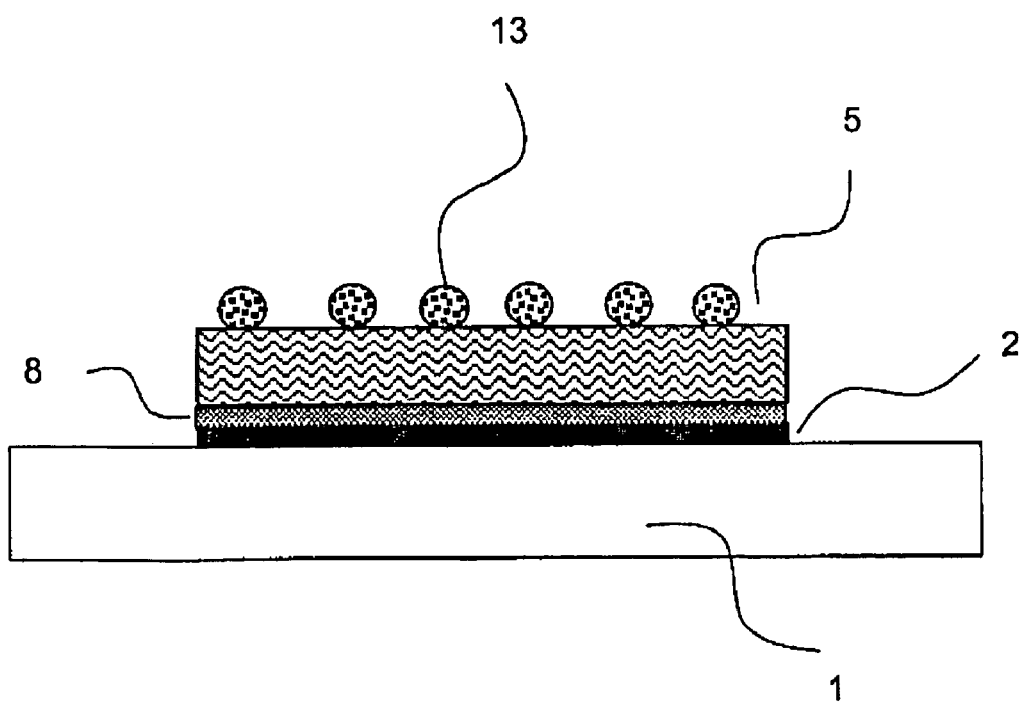
Figure 4C:
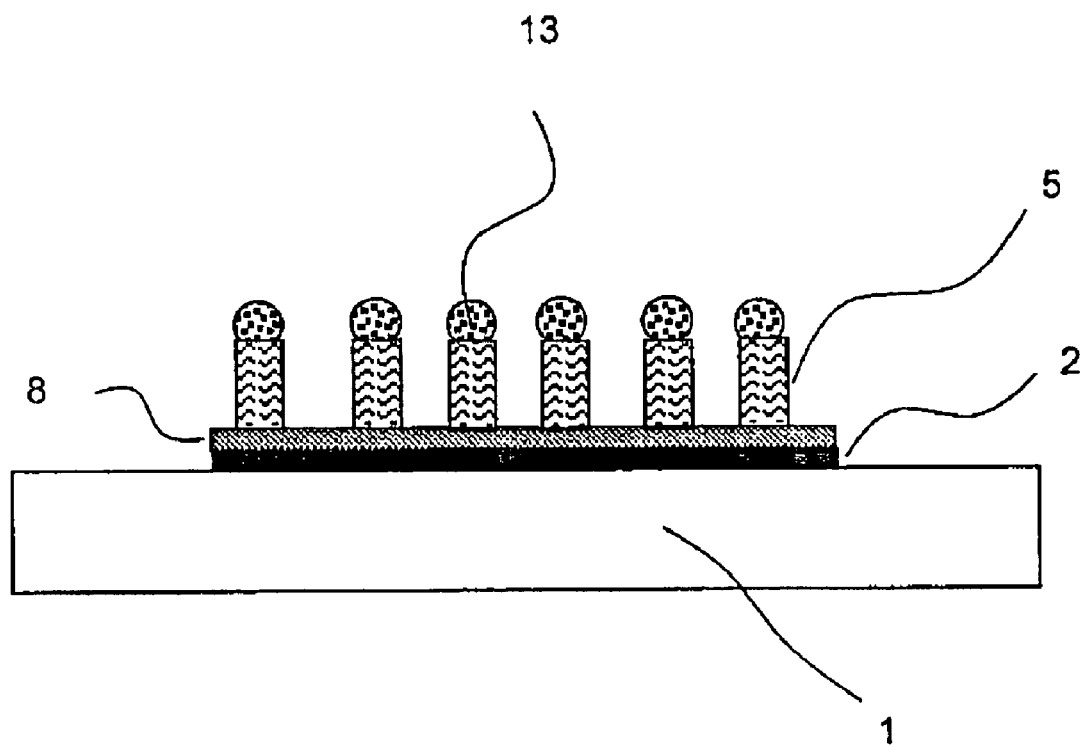
Figure 4D:
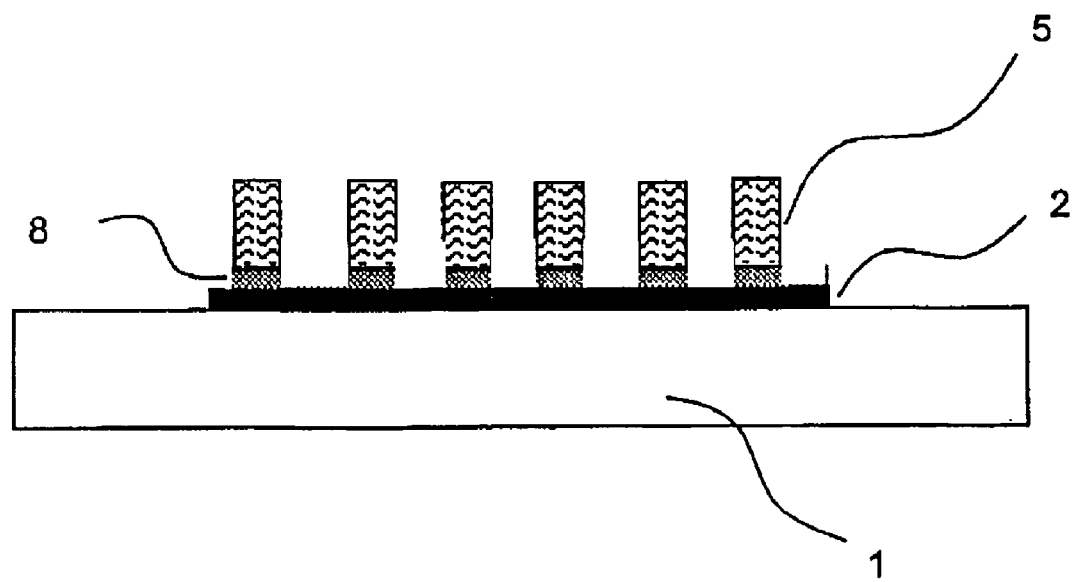

Thereafter, the gate electrode 5 and the insulating layer 8 are etched by using the nanoparticles 13 as the etch mask to obtain a structure shown in FIG. 4C. The nanoparticles 13 are removed by using a solvent or selective etching to form the structure shown in FIG. 4D.

Figure 4E:
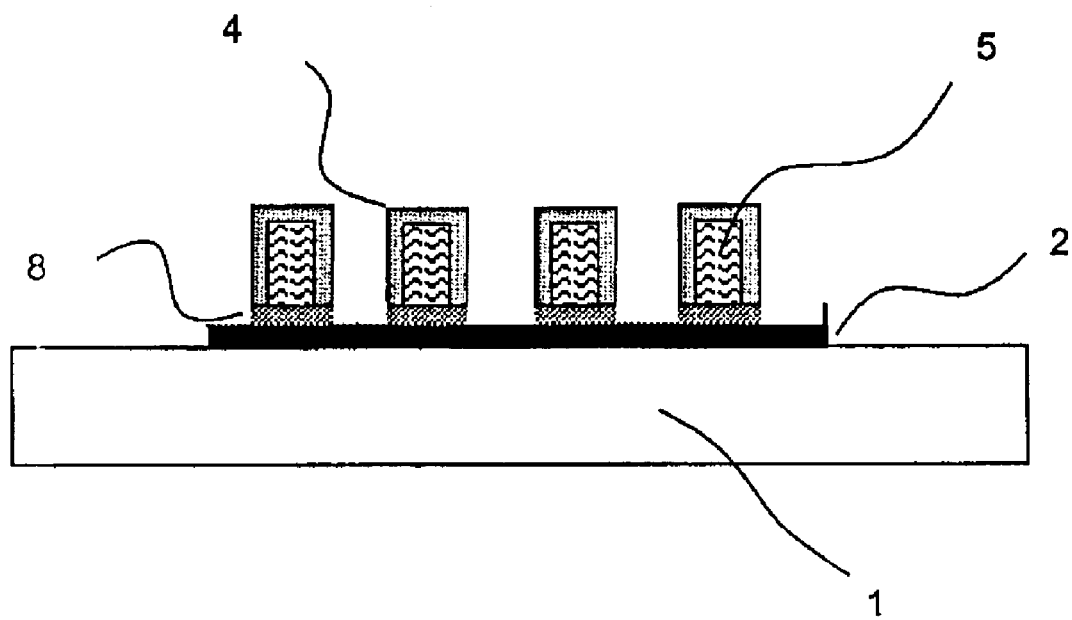
Figure 4F:
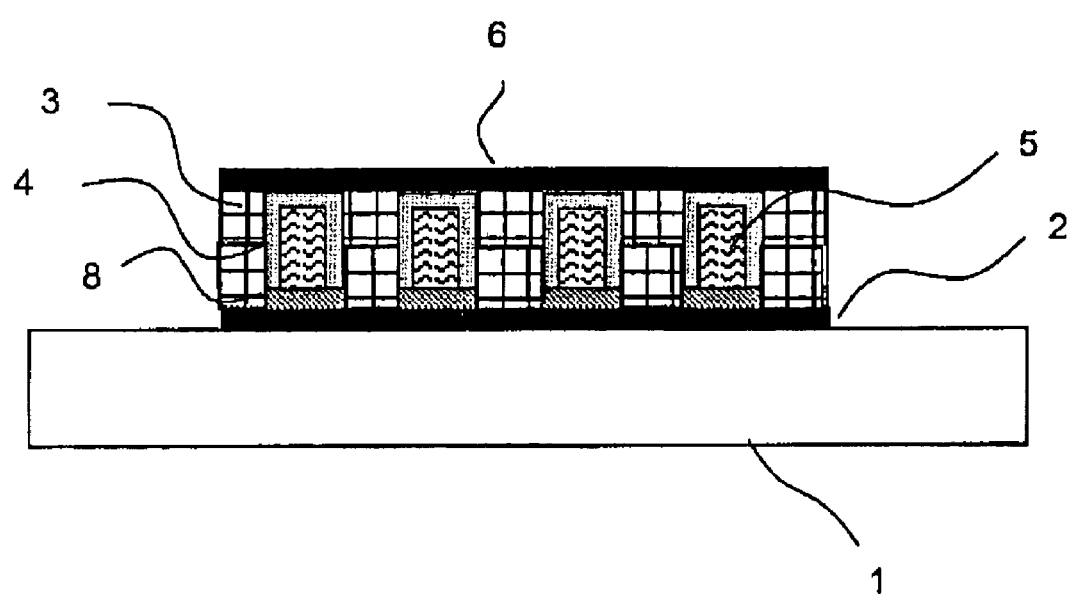

As shown in FIG. 4E, an oxide layer, in other words, a charge carrier block layer 4, is formed on the gate electrodes 5 to operate as a dielectric layer. Thereafter, an organic semiconductor 3 and a drain electrode 6 as in the vertical organic field-effect transistor according to the first embodiment of the present invention are applied to the structure of FIG. 4E to complete the vertical organic field-effect transistor according to the second embodiment of the present invention. Here, holes are etched in the gate electrodes 5 formed of a metal layer. The flanks of the holes and the surfaces of the gate electrodes 5 are coated by using the oxide operating as the charge carrier block layer 4.

FIGS. 5A through 5D are sectional views illustrating a method of manufacturing a vertical organic field-effect transistor according to a third embodiment of the present invention.

Figure 5A:
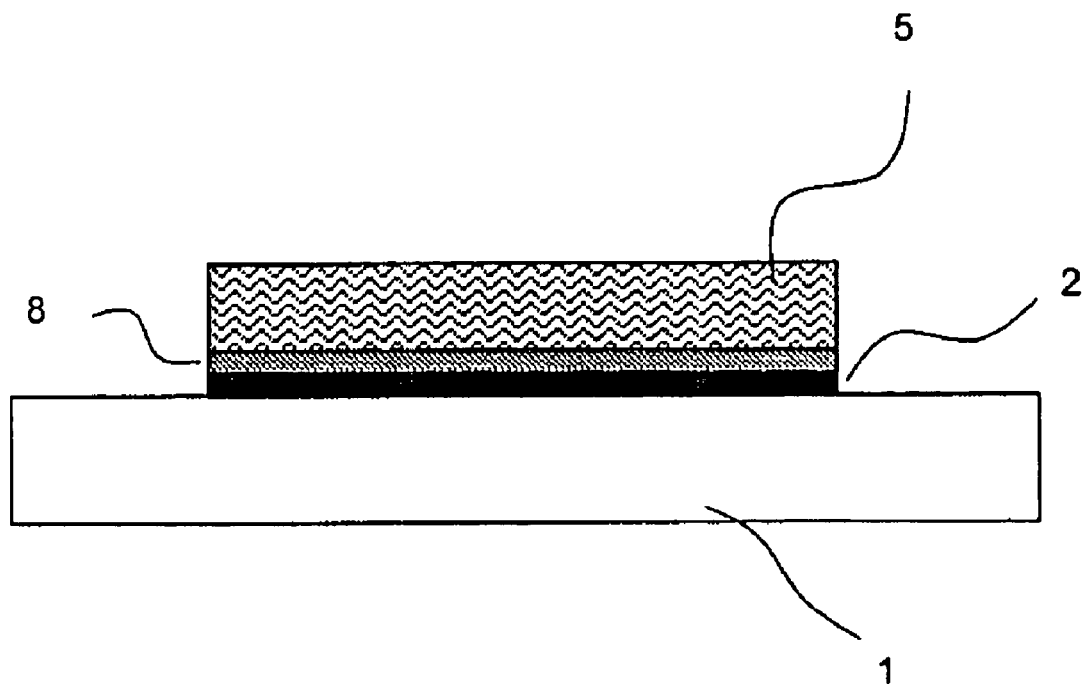
FIGS. 5A, 5B, 5C, and 5D are sectional views illustrating a method of manufacturing an organic field-effect transistor according to a third embodiment of the present invention.
Figure 5B:
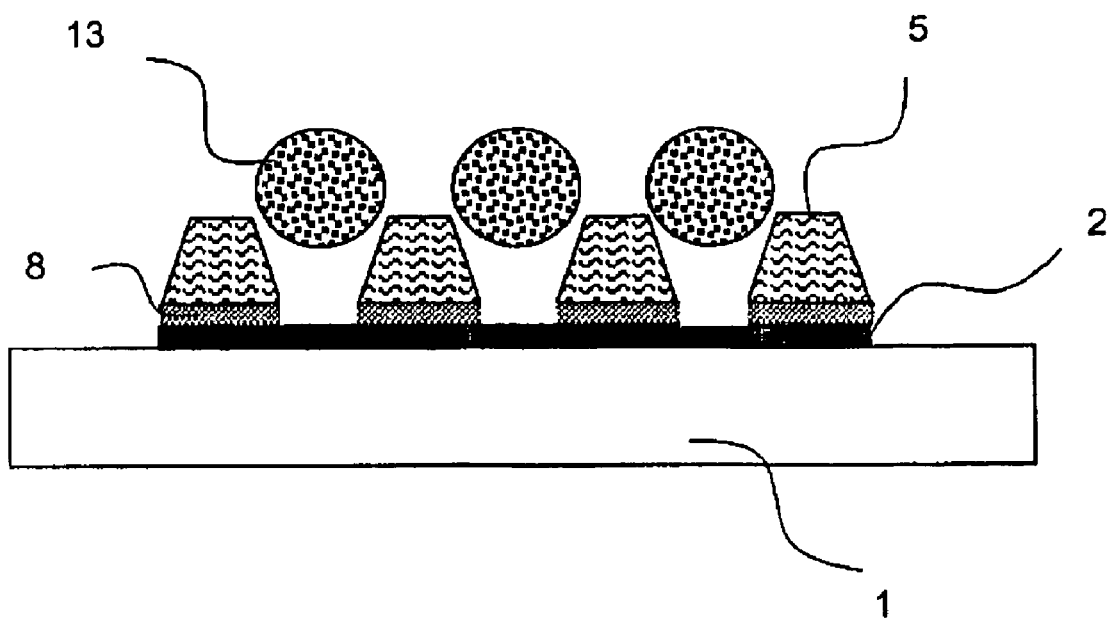
Figure 5C:
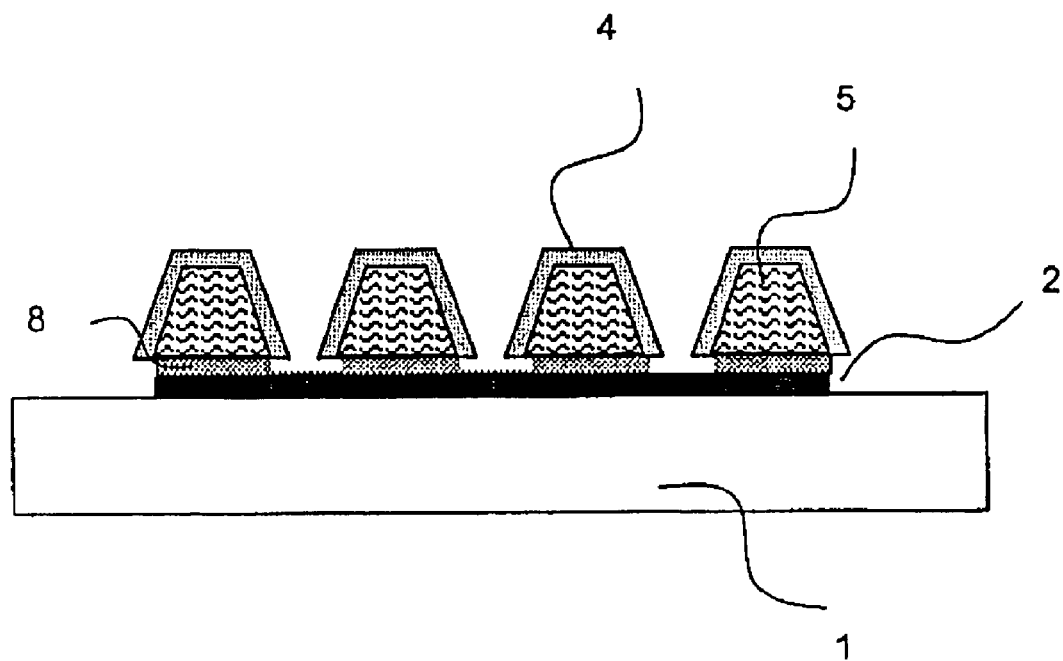
Figure 5D:
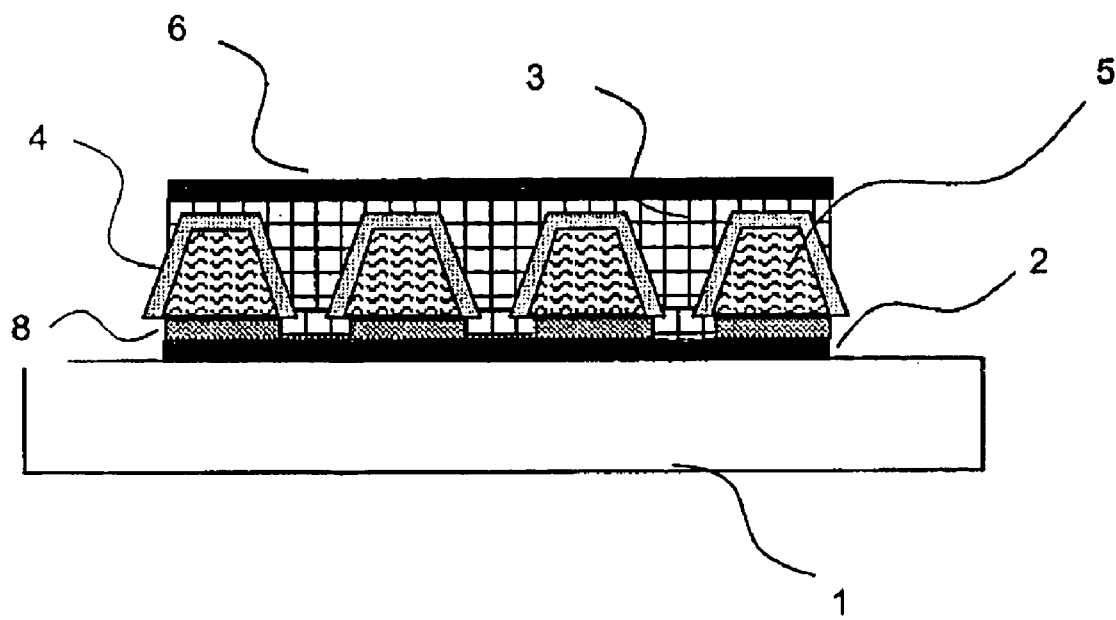

In order to form a vertical organic field-effect transistor shown in FIG. 5D, the structure shown in FIG. 5A is formed. Here, a source electrode 2, an insulating layer 8, and a continuous gate electrode 5 are formed on a substrate 1. The source electrode 2 is formed of a precious metal, such as Au, Pd, Pt, and Ni, and the insulating layer 8 may be formed of $Al_2O_3$, $SiO_2$, $SiO_x$, $TiO_2$, $Ta_2O_5$, $ZrO_2$, or $HfO_2$. The material of the gate electrode 5 is determined based on the material of the insulating layer 8. Here, the gate electrode 5 and the insulating layer 8 may be formed of Al and $Al_2O_3$ or Ta and $Ta_2O_5$.

The structure of FIG. 5A is scratched/polished by using the suspension of nanoparticles 13 having a uniform size to form grooves in the insulating layer 8 and the gate electrodes 5, as shown in FIG. 5B. Here, the nanoparticles 13 may be formed of silicon oxide, aluminum oxide, or titanium oxide.

The gate electrodes 5 are anodized and coated by using an oxide layer, which is provided as a charge carrier block layer 4, as shown in FIG. 5C. Then, an organic semiconductor 3 is vaporized under a high vacuum or spin coated from a solution, and a drain electrode 6 is applied to the structure in order to complete the vertical organic field-effect transistor. The drain electrode 6 is formed of a metal, which is vaporized under a high vacuum or sputtered. The gate electrodes 5 are formed of a metal layer, and the metal layer is mechanically processed by the nanoparticles 13 to scratch the grooves in the metal layer. In addition, the remaining surface of the gate electrodes 5, as well as the flanks of the grooves, is coated by the charge carrier block layer 4, which operates as a dielectric.

FIGS. 6A through 6F are sectional views illustrating a method of manufacturing a vertical organic field-effect transistor according to a fourth embodiment of the present invention.

Figure 6A:
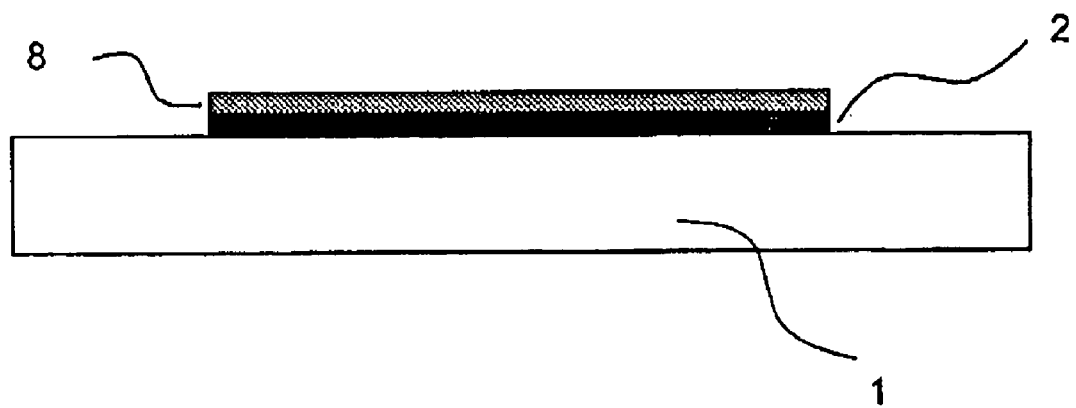
FIGS. 6A, 6B, 6C, 6D, 6E, and 6F are sectional views illustrating a method of manufacturing an organic field-effect transistor according to a fourth embodiment of the present invention.
Figure 6B:
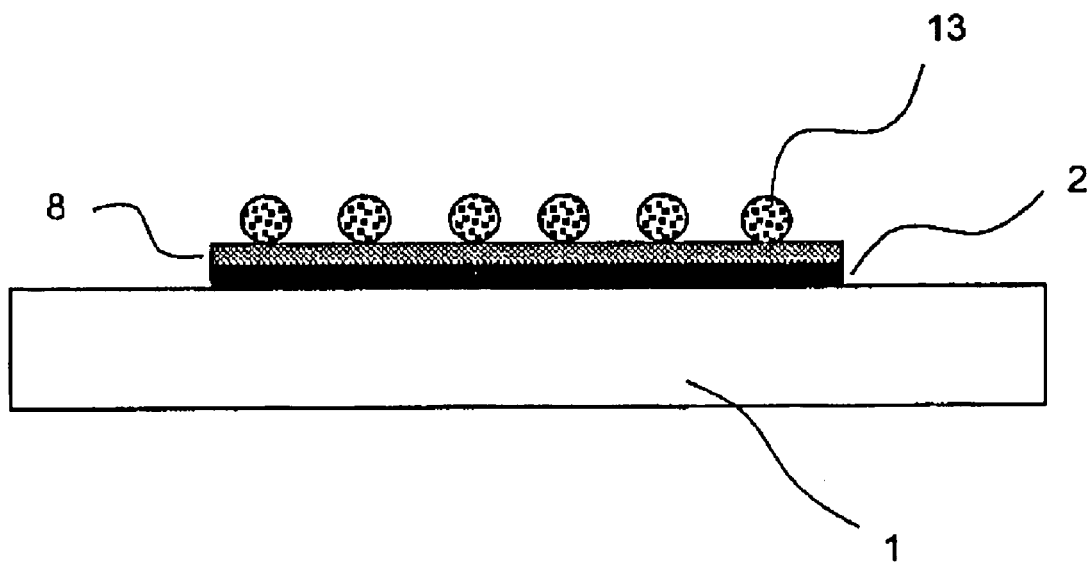

A source electrode 2 and an insulating layer 8 are formed on a substrate 1 as shown in FIG. 6A. Here, the source electrode 2 may be formed of gold, nickel, palladium, platinum, or ITO, and the insulating layer 8 may be formed of silicon dioxide. Then, nanoparticles 13 having a predetermined size are formed on the insulating layer 8. Here, the nanoparticles 13 may be formed of silicon dioxide or polymer latex. In other words, the nanoparticles 13 may be formed of particles that generate a vapor analysis material by a thermal process to remove a covering gate metal, for example, polystyrene.

Figure 6C:
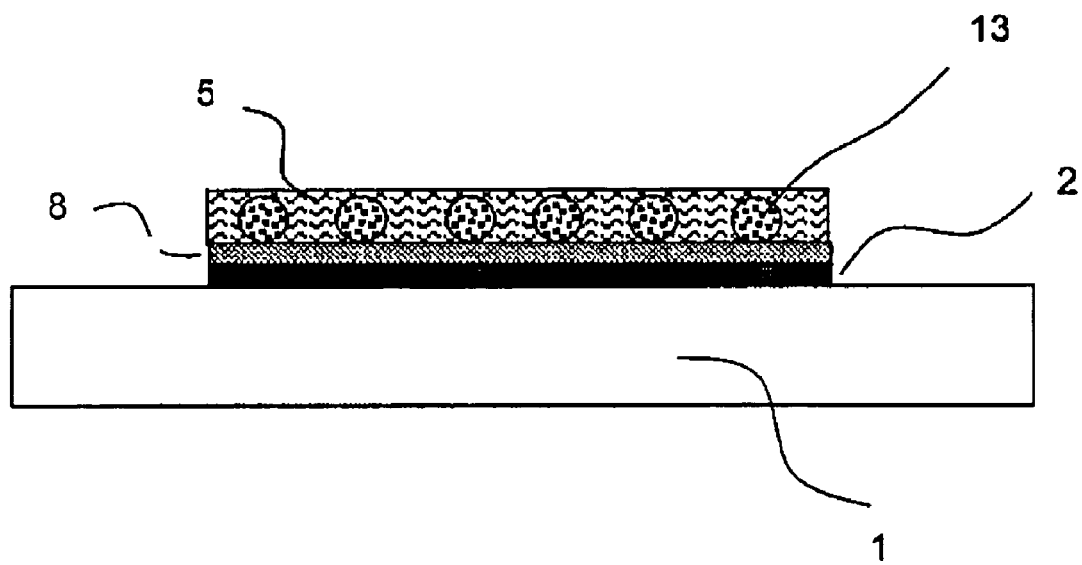

Thereafter, a gate electrode 5 is formed by vaporization under a high vacuum or sputtering. In this case, the gate electrode 5 may be formed of aluminum. Here, the nanoparticles 13 operate as a mask for areas on which the gate electrode 5 is not deposited, as shown in FIG. 6C.

The nanoparticles 13 are removed from the gate electrode 5 through a mechanical process using a cleaner in a supersonic wave bath. When the polymer latex is used as the nanoparticles 13, the polymer latex may be removed by performing an additional temper process in addition to a pyrolysis at a temperature of 200 to 400° C. while generating a vapor analysis material.

The nanoparticles 13 remaining in the gate electrode 5 can be etched. In general, the nanoparticles 13 and the insulating layer 8 are etched by using an etchant, which does not etch the gate electrode 5.

For example, when the nanoparticles 13 are formed of $SiO_2$, a medium including fluorine, for example, $CF_4$, is used as the etchant. As a result, the openings of the insulating layer 8 are etched. When the nanoparticles 13 are formed of the polymer latex, the nanoparticles 13 may be oxygen plasma processed by using the admixture of $CF_4$.

Figure 6D:
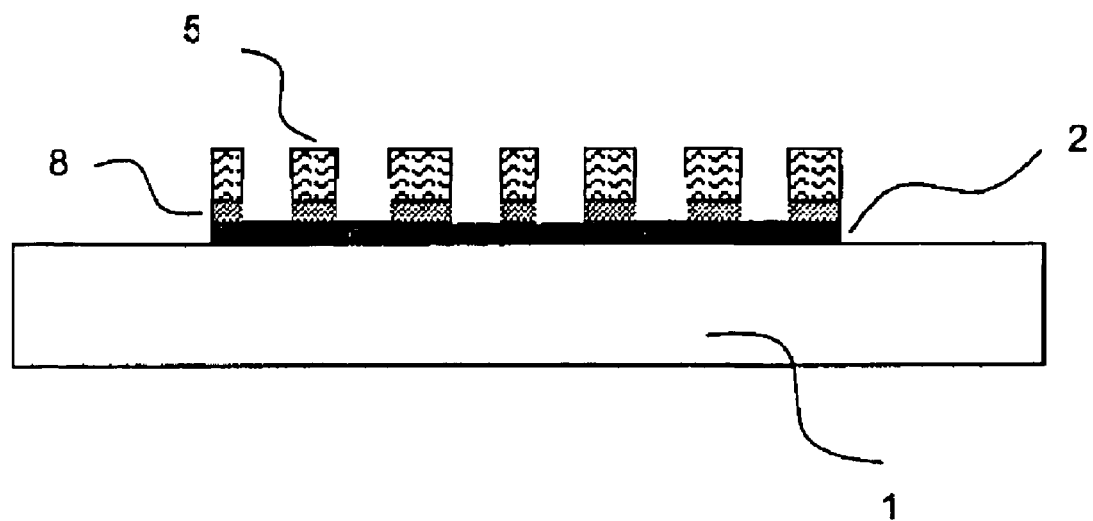
Figure 6E:
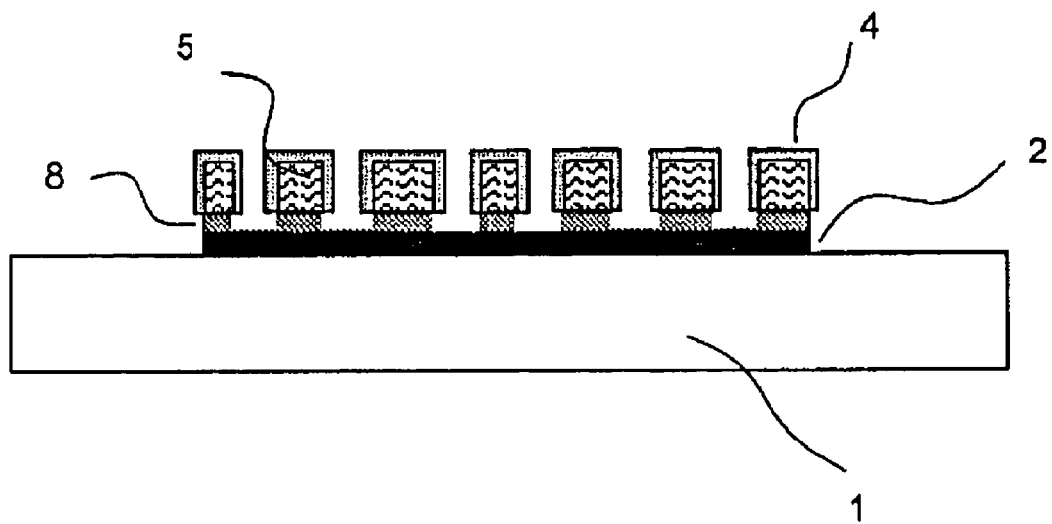
Figure 6F:
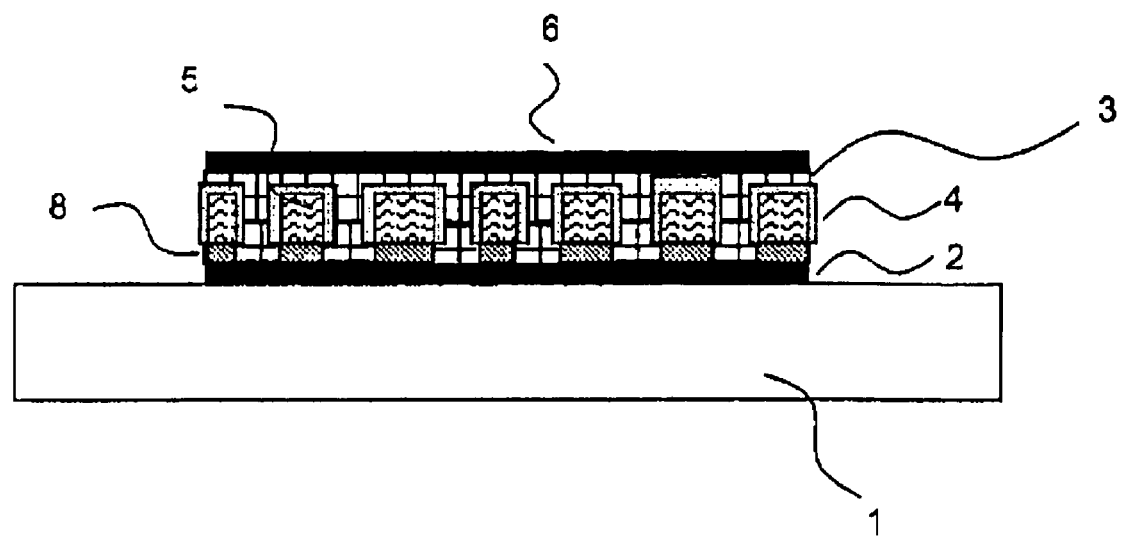

The structure of FIG. 6D is anodized to form a structure of FIG. 6E, and a charge carrier block layer 4, in other words, a dielectric layer, is formed through a metal oxidation. When the gate electrode 5 is formed of aluminum, the anodizing may be performed in a diammonium citrate solution as an electrolyte by using an end voltage of 80 V.

Then, an organic semiconductor 3 is formed by vaporization under a high vacuum or spin coating from a solution. When the organic semiconductor 3 is formed by spin coating, regio-regular polyalkylthiophene, which can be deposited from an organic solution, may be used as the organic semiconductor 3. A drain electrode 6 is vaporized under a high vacuum to complete the structure of FIG. 6F. The drain electrode 6 may be formed of gold, nickel, palladium, platinum, or ITO.

Figure 7:
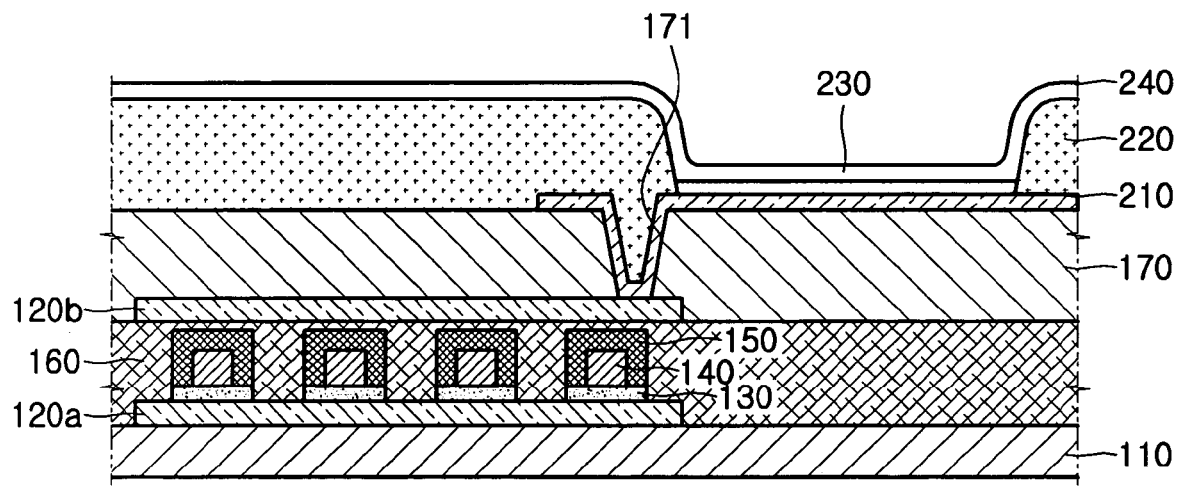
FIG. 7 is a sectional view illustrating a vertical organic field-effect transistor and an organic field-effect light-emitting display device having the same according to the present invention.

FIG. 7 is a sectional view illustrating a display device having a vertical field-effect transistor according to the present invention.

A source electrode 120a as a first electrode is formed on one surface of a glass substrate 110. An insulating layer 130 is formed on the surface of the source electrode 120a. Here, the insulating layer 130 may be formed of $Al_2O_3$, $SiO_2$, $SiO_x$, $Si_3N_x$, $TiO_2$, $Ta_2O_5$, $ZrO_2$, or $HfO_2$, as described above.

Gate electrodes 140 are formed on the insulating layer 130, and charge carrier block layers 150 are formed on the surfaces of the gate electrodes 140 in order to insulate the gate electrodes 140 from other layers. Here, the charge carrier block layers 150 may be formed by thermal oxidation, plasma oxidation, or anodizing. An organic semiconductor layer 160 is formed on the gate electrodes 140 and in the spaces between the gate electrodes 140. A drain electrode 120b is formed on the organic semiconductor layer 160, and a transistor insulating layer 170 as an insulating layer for protecting and insulating the structure under the transistor insulating layer 170 is formed on the drain electrode 120b.

Here, the transistor insulating layer 170 may be formed of an inorganic material, such as SiNx, or formed by arranging an organic layer, such as benzocyclobutene (BCB) or acryl, on the inorganic material. The transistor insulating layer 170 may be formed of a single layer or multi-layers. The transistor layer can be formed by the method of manufacturing the vertical field-effect transistor described above.

A pixel layer including a first pixel electrode 210, a second pixel electrode 240, and an organic field-effect light-emitting unit 230 therebetween is formed on the transistor insulating layer 170. The first pixel electrode 210 and the second pixel electrode 240 may include more than one of ITO, Al, and Mg—Ag, and the structures of the first and second pixel electrodes 210 and 240 depend on the light-emitting type of the display device, for example, a front plate light-emitting type or a rear plate light-emitting type. The first pixel electrode 210 is electrically connected to the drain electrode 120b through a via hole 171 of the transistor insulating layer 170. The pixels of emitting light are defined by pixel define layers 220.

The organic field-effect light-emitting unit 230 may be formed of a small molecular organic layer or a polymer organic layer. When the small molecular organic layer is used, one or more than one of a hole injection layer (HIL), a hole transport layer (HTL), an emission layer (EML), an electron transport layer (ETL), and an electron injection layer (EIL) are used. In addition, the small molecular organic layer is formed of copper phthalocyanine (CuPc), N,N'-Di(naphthalene-1-yl)-N,N'-diphenyl-benzidine (NPB), and tris-8-hydroxyquinoline aluminium (Alq3). The smaller molecular organic layer is formed by a vacuum deposition.

When the polymer organic layer is used, the layer is formed as the HTL and the EML. Here, PEDOT is used as the HTL, and a polymer organic material of poly-phenylenevinylene (PPV) group or polyfluorene group is used as the EML. In addition, the polymer organic layer may be formed by screen printing or inkjet printing.

The operation of the organic field-effect display device according to the present invention will now be described. An electric signal from the source electrode 120a, which is formed by an electric signal applied to the gate electrodes 140, is transferred to the drain electrode 120b through a channel formed adjacent to the gate electrodes 140 of the organic semiconductor layer 160. The electric signal transferred to the drain electrode 120b is transferred to the first pixel electrode 210 through the via hole 171. Accordingly, the organic field-effect light-emitting unit 230, which is interposed between the first pixel electrode 210 and the second pixel electrode 240, emits light based on the transferred electric signal.

The vertical field-effect transistor may be applied to an inorganic field-effect display device and/or a liquid crystal display (LCD), as well as the organic field-effect display device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A vertical field-effect transistor, comprising:
   a substrate;
   a first electrode formed on one surface of the substrate;
   an insulating layer formed on at least a portion of the first electrode;
   discontinuous gate electrodes formed on one surface of the insulating layer while including an oxide layer as a charge carrier block layer on at least one surface to insulate the discontinuous gate electrodes from adjacent conductive layers; and
   an organic semiconductor layer arranged between a discontinuous gate electrode and a second electrode,
   wherein the second electrode is arranged on the discontinuous gate electrodes and the organic semiconductor layer, and
   wherein the discontinuous gate electrodes are formed of metal nanoparticles.

2. The vertical field-effect transistor of claim 1, wherein the discontinuous gate electrodes include at least one of Al and Cr.

3. A display device, comprising:
   a substrate;
   a transistor layer formed on one surface of the substrate;
   a transistor insulating layer formed on one surface of the transistor layer; and
   a pixel layer including at least one pixel and electrically connected to the transistor layer through a via hole formed in the transistor insulating layer,
   wherein the transistor layer includes more than one vertical field-effect transistor comprising:
   a first electrode;
   an insulating layer formed on at least a portion of the first electrode;
   discontinuous gate electrodes formed on one surface of the insulating layer while including an oxide layer as a charge carrier block layer on the portion of the surface other than the portion contacting the insulating layer; and
   an organic semiconductor layer arranged between a discontinuous gate electrode and a second electrode,
   wherein the second electrode is arranged on the discontinuous gate electrodes and the organic semiconductor layer, and
   wherein the discontinuous gate electrodes are formed of metal nanoparticles.

4. The display device of claim 3, wherein the discontinuous gate electrodes include at least one of Al and Cr.

5. The display device of claim 3, wherein at least one portion of the pixels in the pixel layer includes:
   a first electrode layer electrically connected to the transistor layer;
   a field-effect light-emitting unit formed on one surface of the first electrode layer; and
   a second electrode layer formed on the field-effect light-emitting unit.

* * * * *